Nov. 14, 1967 J. SWYT 3,352,331

WIRE COMBING

Filed Aug. 31, 1965 3 Sheets-Sheet 1

INVENTOR.
JOSEPH SWYT
BY
Glenn A. Bruestle
Attorney

INVENTOR.

JOSEPH SWYT

BY

Attorney

Nov. 14, 1967 J. SWYT 3,352,331
WIRE COMBING
Filed Aug. 31, 1965 3 Sheets-Sheet 3
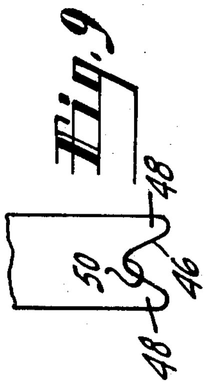
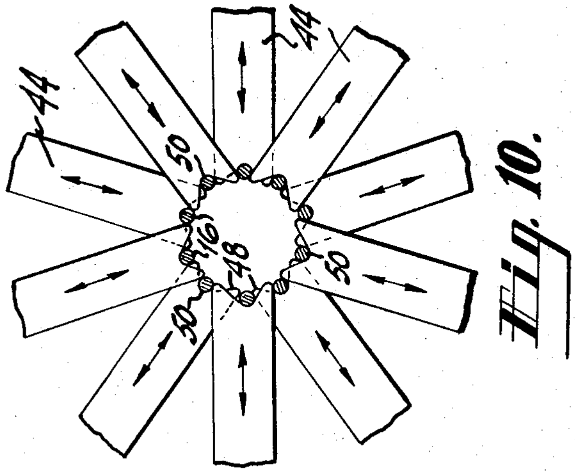
Fig. 10.
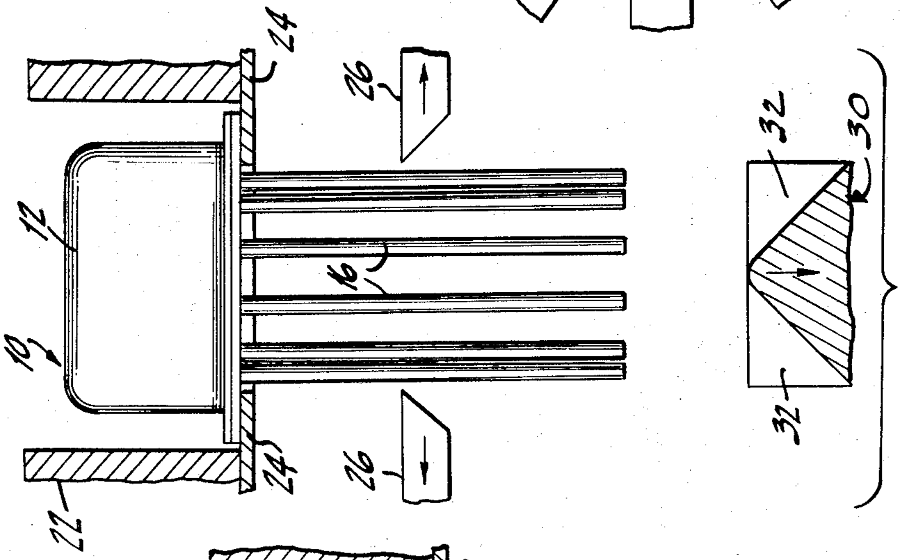
Fig. 8.
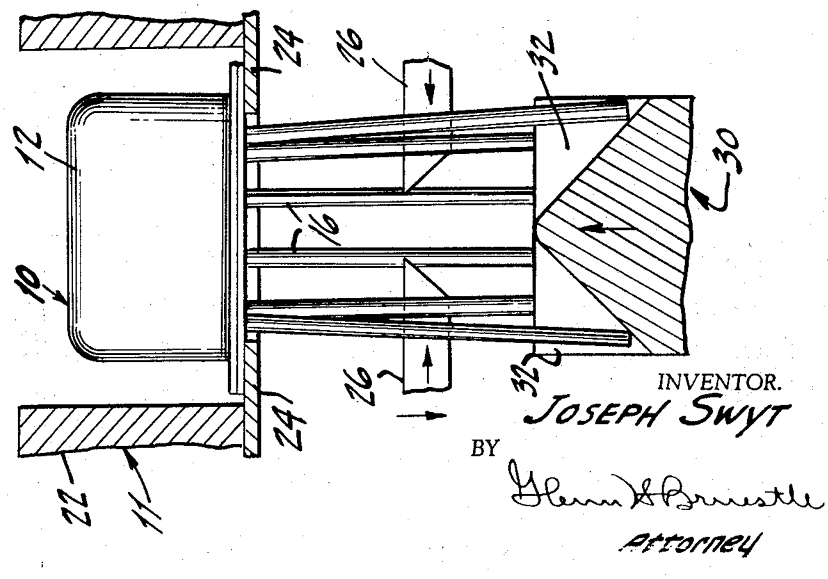
Fig. 7.
INVENTOR.
JOSEPH SWYT
BY Glenn H. Bruestle
Attorney United States Patent Office 3,352,331

Patented Nov. 14, 1967

3,352,331
WIRE COMBING

Joseph Swyt, Plainfield, N.J., assignor to Radio Corporation of America, a corporation of Delaware Filed Aug. 31, 1965, Ser. No. 483,914
2 Claims. (Cl. 140—147)

ABSTRACT OF THE DISCLOSURE

The bunched leads of an electronic device having a rigid envelope portion through which the leads extend are straightened by moving a plurality of fingers between the leads adjacent to the rigid member and inwardly of the array of leads. The leading ends of pairs of fingers touch to form a V encompassing each lead. The array of V-forming fingers are moved towards the bunched ends of the leads, thereby forcing them apart.

This invention relates to wire combing, and particularly to methods for separating and straightening the terminals or lead wires of various devices such as transistors, electron tubes, or the like.

The invention is described in connection with the manufacture of transistors.

Certain types of transistors comprise a header wafer having a plurality of circularly arrayed, flexible wires or leads extending unidirectionally from one face of the wafer. To facilitate socketing of the leads, it is desired that the leads be parallel. During manufacture of the transistor, however, it frequently occurs that the leads become bunched, and, in some instances, even become entangled with one another. Major causes of difficulty with respect to separating and straightening the leads is that they are closely spaced together and are made from wires of small diameter. Heretofore, it has not been known how to provide efficient methods utilizing inexpensive and simple tools for separating and straightening the leads of such devices.

An object of this invention is to provide improved and novel methods for combing wires extending from an electrical device.

Another object of this invention is to provide novel and improved methods utilizing simple and inexpensive tools for separating and straightening leads of devices such as transistors or the like.

For achieving these objects, use is made of the fact that, even under the worst conditions of bunching and entangling of leads normally encountered, the leads are in spaced apart relation immediately adjacent to the body of the device, i.e., at the stem through which the leads are secured.

According to one embodiment of the invention, a plurality of fingers are moved, in a plane adjacent to the stem, radially inwardly of a circular array of leads. At least one finger is moved inwardly between each pair of adjacent leads until the leading ends of fingers on each side of each lead substantially meet within the circle of leads. Thereafter, the array of inwardly extended fingers is moved towards the free ends of the leads, whereby the leads are separated and straightened by engagement of the leads with the converging portions of the fingers.

After the free ends of the leads have been separated, and preferably while the fingers are engaged with the leads, a pin having tapered grooves, or the like is moved into the array of leads from the free ends of the leads for further spreading the leads to an extent whereby, upon removal of the fingers and pin, the leads assume a parallel circular array.

In the drawings:

FIG. 3 is a view similar to FIG 1 but showing the condition of the apparatus at a later time in a process for combing and straightening the transistor leads;

FIGS. 7 and 8 are views similar to FIG. 5 but at successively later times;

FIG. 9 is a plan view of a modification of the fingers shown in FIG. 2; and

FIG. 10 is a view similar to FIG. 4 but at a later time and showing an array of fingers of the type shown in FIG. 9.

Figures 1, 2, 4:
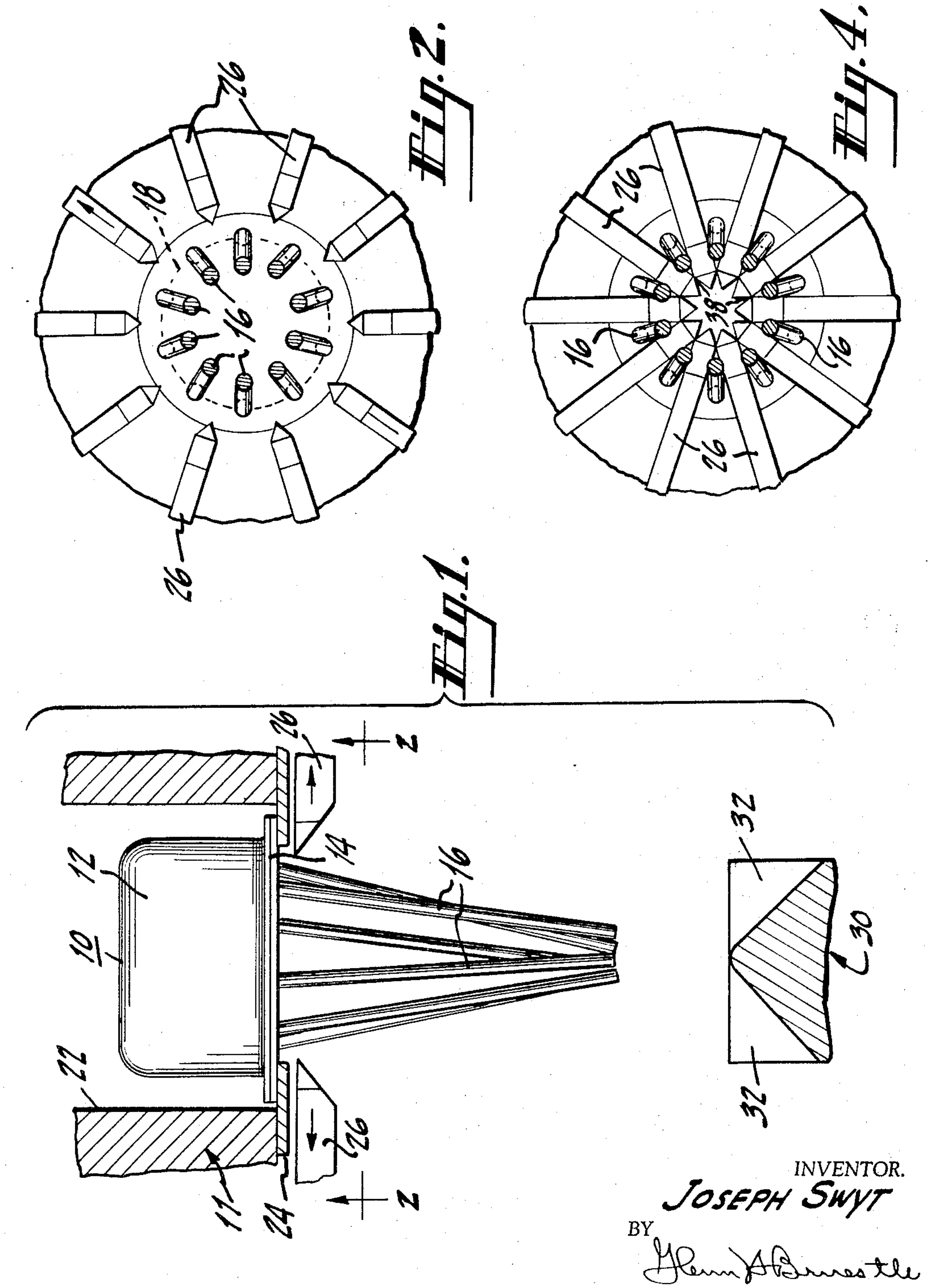
FIG. 1 is a fragmentary view, in section, of apparatus for combing and straightening the leads of a transistor shown mounted in the apparatus.
FIG. 2 is a section along line 2—2 of FIG. 1.
FIG. 4 is a section along line 4—4 in FIG. 3.

With reference to FIG. 1, a transistor 10 is shown mounted in a jig 11. Transistor 10 comprises an envelope 12 including a stem 14 through which are sealed a plurality of leads 16 arranged around a circle 18 (FIG. 2). During manufacture of the transistor 10 it frequently occurs that the leads 16 become bunched at their free ends as shown in FIG. 1.

Figure 5:
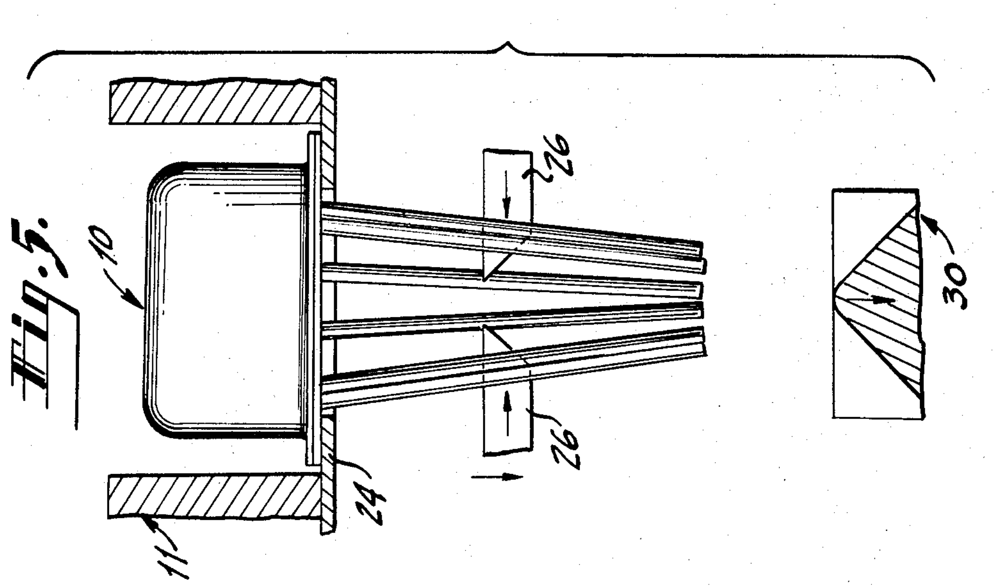
FIG. 5 is a view similar to FIG. 3 but at a still later time.

Jig 11 comprises a circular side wall 22 and a bottom support 24. Disposed beneath and close to support 24 are a plurality of radially extending fingers 26. The number of fingers 26 equals the number of leads 16 of the transistor, and the transistor is disposed (FIG. 2) relative to the fingers 26 so that each finger 26 is radially aligned with the space between adjacent leads. The free ends of the fingers 26 are pointed. The fingers 26 are movable radially inwardly of the circle 18 of the leads 16 until the free ends of the fingers 26 engage one another, as shown in FIG. 4. The fingers 26 are also movable as a unit away from the envelope 12 in a direction perpendicular to the plane of the lead circle 18, as shown in FIG. 5.

Mounted for upward movement along an axis passing through the center of the lead circle 18 is a pin 30, only the tip of which is shown. The top of pin 30 is provided with a plurality of circularly arranged longitudinally extending slots or grooves 32, the bottom of the grooves being angled with respect to the longitudinal axis of the pin. The number of grooves 32 equals the number of leads 16 to provide engagement of the leads within the grooves on a one to one basis.

Provision of apparatus of a tape suitable for mounting a transistor 10 with its leads 16 extending in a downward direction, and for mounting the fingers 26 and the pin 30 for movements in the manner described is well within the skill of a person skilled in the art. For purposes of simplicity and brevity, an example of such apparatus is not shown.

Although the lower free ends of the leads 16 are bunched together, and may even be entangled, the leads adjacent to the stem 14 of the transistor are uniformly spaced around the lead circle 18. To take advantage of this, the fingers 26 are initially disposed closely adjacent to the stem 14 of the transistor 10 as shown in FIG. 1. Also, the fingers 26 are pointed, as mentioned, thereby further insuring passage of the fingers 26 between the leads 16 upon inward movement of the fingers.

For separating and spreading the leads 16 of a transistor 10 mounted in the apparatus described, the fingers 26 are moved radially inwardly between the leads 16 (FIG. 3) until the leading ends of the fingers engage one another (FIG. 4) and form a substantially closed ring within the circle 18 of the leads. Pairs of fingers form a V which encompasses each lead 26 with the apex 38 of the V inside the lead circle 18. The diameter of the ring of finger ends is less than that of the lead circle 18 but encloses an area somewhat larger than the area encompassed by the bunched free ends of the leads 16.

Figure 6:
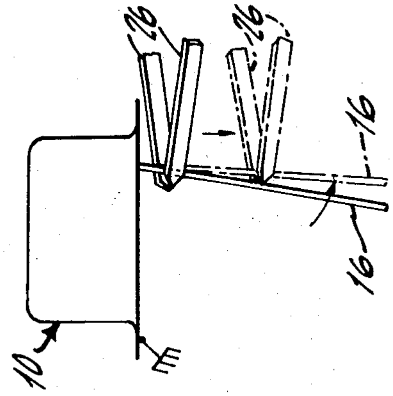
FIG. 6 is a diagrammatic view illustrating the effect of moving the fingers of the apparatus in a downward direction.

The closed array of fingers 26 is then moved downwardly towards the free ends of the leads in a direction perpendicular to the plane of the lead circle 18. Upon downward movement of the fingers 26, as shown in FIGS. 5 and 6, the converging leads 16 are each engaged with the inside surface of the V formed by adjacent fingers 26 and the leads are forced outwardly. The array of fingers 26 is preferably not moved all the way to the ends of the leads 16 but a distance sufficient to cause some spreading apart of the lead free ends.

Figure 7:
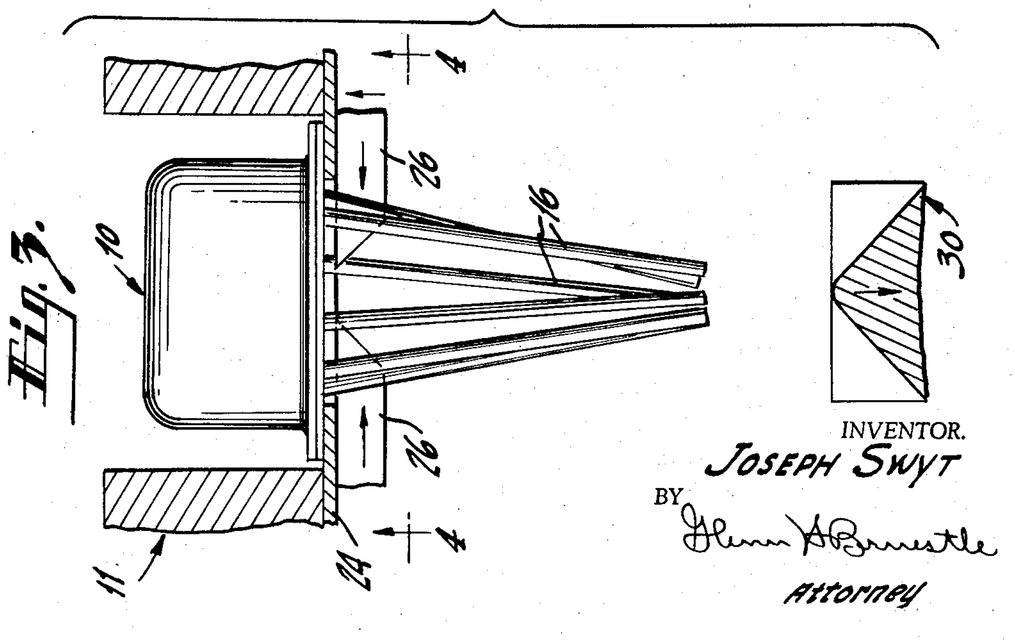

The pin 30 is then moved upwardly and into the array of leads past the lead open ends, as shown in FIG. 7, until each lead is engaged within a tapered groove 32 in the pin. The tapered grooves 32 further spread the leads 16 apart.

Because of the resiliency and spring back of the wires of which the leads 16 are made, it is generally preferable to spread the leads until they diverge from one another, as shown in FIG. 7. The amount of divergence is selected so that upon removal of the fingers 26 and the pin 30, the leads 16 spring into a parallel circular array, as shown in FIG. 8.

In some instances, the leads 16 of a transistor 10 may both converge and diverge with respect to one another. For combing and straightening such nonparallel leads, fingers 44 of a type shown in FIG. 9 are used. Each finger 44 has a V groove 46 in the end thereof providing two sub-fingers 48.

In the use of fingers 44, the transistor 10 is oriented with respect to the array of fingers 44 such that the apex 50 of the V groove 46 of each finger is aligned with each lead 16. Upon radial inward movement of the fingers 44, as shown in FIG. 10, the apex 50 of each V groove 46 is disposed adjacent to a lead 16, and the sub-fingers 48 extend inwardly of the circle of the leads and adjacent to other, adjacent leads.

Alternate fingers 44 overlap, and when the fingers 44 are in their radially inward position, as shown, each lead is encompassed by a substantially closed ring comprising the apex 50 of the V groove 46 of one finger 44 and a sub-finger 48 of each of the two fingers adjacent to the one finger.

The array of closed fingers is thereafter moved downwardly towards the ends of the leads thereby straightening both the diverging and converging leads and disposing them in parallel array. In this embodiment, the array of fingers 44 is moved along the full length of the leads. A pin 30 of the type shown in FIG. 7 is generally not used.

What is claimed is:

1. A method of combining the lead wires of a device including a member and a plurality of leads arranged around a circle, said leads extending substantially unidirectionally from said member, the free ends of some of said leads being bunched, said method comprising:

passing at least one finger radially inwardly between each pair of adjacent leads and adjacent to said member until the leading ends of pairs of fingers extending past opposite sides of leads substantially meet within said lead circle, and maintaining the relative disposition of said fingers and moving said fingers towards the ends of said wires for spreading said wires.

2. The method of disposing the lead wires of a device into a cylindrical array, said device comprising a solid member and a plurality of circularly arrayed leads extending from said member, the free ends of said leads being bunched together, said method comprising:

passing fingers radially inwardly of the circle of leads adjacent to said member and between adjacent leads until the leading ends of said fingers form a substantially closed ring within the circle of said leads, moving said ring of finger ends towards the free ends of said leads in a direction perpendicular to the plane of the lead circle for spreading apart the bunched ends of said leads, and while said leads are maintained spread apart by said fingers, inserting a pin longitudinally inwardly of the array of leads from the free ends thereof for further spreading said leads.

References Cited

UNITED STATES PATENTS

| | | | |
|---|---|---|---|
| 3,075,562 | 1/1963 | Jankowski | 140—147 |
| 3,106,945 | 10/1963 | Wright et al. | 140—147 |
| 3,165,126 | 1/1965 | Gartner | 140—140 |

RICHARD J. HERBST, *Primary Examiner.*

L. A. LARSON, *Assistant Examiner.*